US010200063B2

(12) United States Patent
Ha et al.

(10) Patent No.: US 10,200,063 B2
(45) Date of Patent: Feb. 5, 2019

(54) MEMORY CONTROLLER, SEMICONDUCTOR MEMORY SYSTEM AND OPERATING METHOD THEREOF

(71) Applicants: SK hynix Inc., Gyeonggi-do (KR); Korea Advanced Institute of Science and Technology, Daejeon (KR)

(72) Inventors: Jeong-Seok Ha, Daejeon (KR); Sang-Ha Lee, Seoul (KR); Dae-Sung Kim, Gwangju (KR)

(73) Assignees: SK Hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/599,576

(22) Filed: May 19, 2017

(65) Prior Publication Data

US 2018/0048329 A1    Feb. 15, 2018

(30) Foreign Application Priority Data

Aug. 12, 2016    (KR) .......................... 10-2016-0102985

(51) Int. Cl.
| | |
|---|---|
| *H03M 13/11* | (2006.01) |
| *G06F 11/10* | (2006.01) |
| *H03M 13/37* | (2006.01) |
| *H03M 13/29* | (2006.01) |
| *H03M 13/00* | (2006.01) |

(52) U.S. Cl.
CPC ......... *H03M 13/1105* (2013.01); *G06F 11/10* (2013.01); *H03M 13/116* (2013.01); *H03M 13/1171* (2013.01); *H03M 13/2957* (2013.01); *H03M 13/3707* (2013.01); *H03M 13/6343* (2013.01)

(58) Field of Classification Search
CPC .......... H03M 13/1105; H03M 13/116; H03M 13/1171; H03M 13/2957; H03M 13/3707; H03M 13/6343; G06F 11/10
See application file for complete search history.

(56) References Cited

U.S. PATENT DOCUMENTS 8,848,438 B2    9/2014  Hu
9,450,610 B1*   9/2016  Micheloni .......... H03M 13/1125
(Continued)

FOREIGN PATENT DOCUMENTS

KR    1020140086369    7/2014

*Primary Examiner* — Kyle Vallecillo
(74) *Attorney, Agent, or Firm* — IP & T Group LLP

(57) ABSTRACT

An operation method of a memory controller includes: reading a second data from memory cells when a hard decision error correction decoding operation based on a first data read from the memory cells fails; calculating a LLR of each bit-data included in the first data by using the first and second data; and performing a soft decision error correction decoding operation based on the LLR, wherein the memory cells include a first and second memory cell, wherein the first data includes first-bit-data read from the first and second memory cell, wherein the second data includes second-bit-data read from the first and second memory cell, wherein the LLR is a LLR of the first-bit-data read from the first memory cell calculated based on the first bit and a second bit read from the first memory cell and a first bit and a second bit read from the second memory cell.

16 Claims, 11 Drawing Sheets

(56) References Cited

U.S. PATENT DOCUMENTS

| | | | |
|---|---|---|---|
| 2011/0083060 A1* | 4/2011 | Sakurada | G11C 11/5642 714/763 |
| 2012/0224420 A1* | 9/2012 | Sakurada | G11C 11/5642 365/185.03 |
| 2013/0077400 A1* | 3/2013 | Sakurada | G11C 11/5642 365/185.03 |
| 2014/0281800 A1* | 9/2014 | Micheloni | G06F 11/1012 714/759 |
| 2014/0281828 A1* | 9/2014 | Micheloni | G06F 11/00 714/773 |

* cited by examiner

<IDEAL>

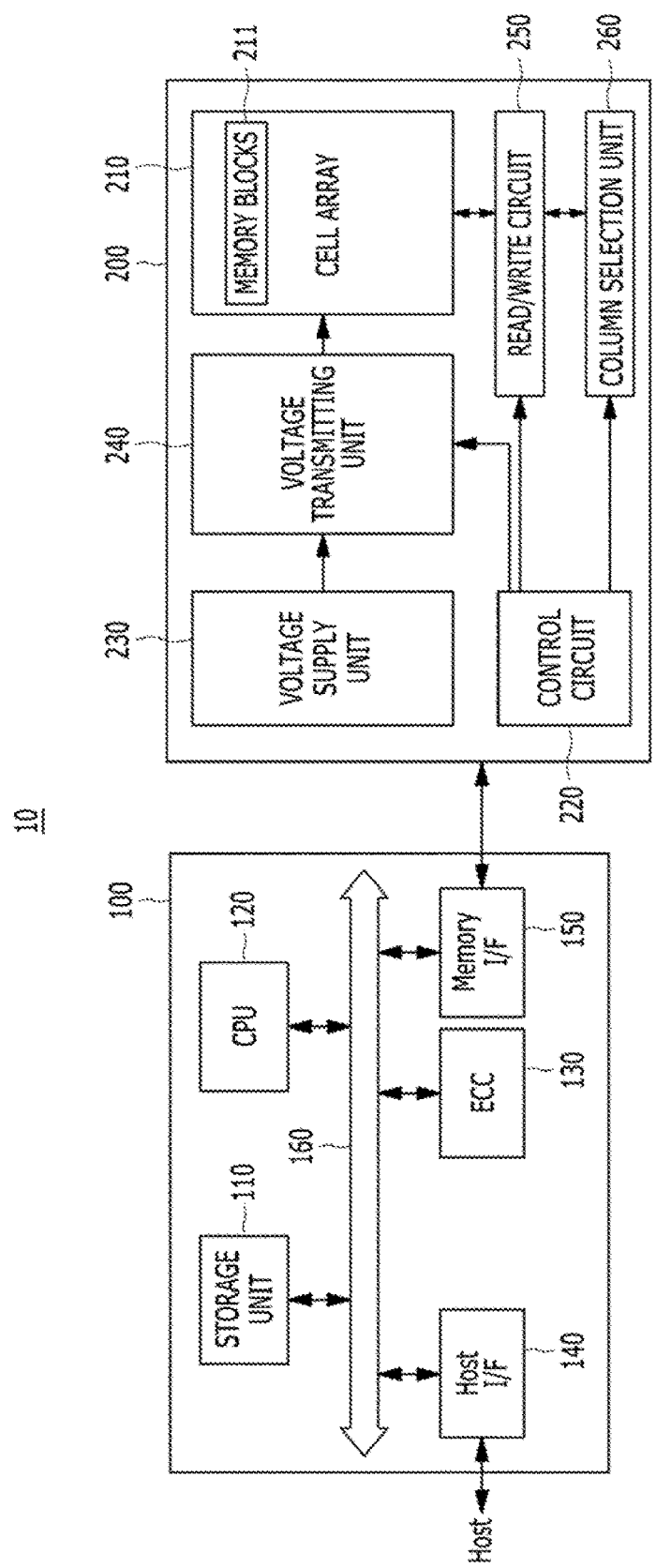

FIG. 7

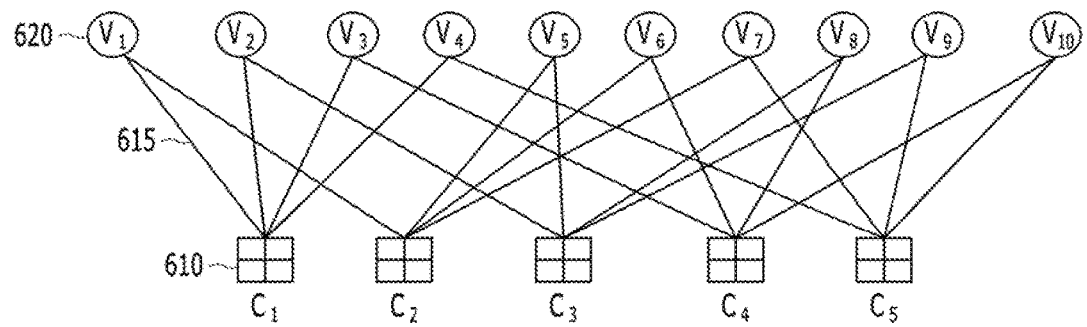

FIG. 8

- After 1 iteration
$\underline{v} = (0 \quad 1 \quad 1 \quad 0 \quad 1 \quad 0 \quad 0 \quad 0 \quad 1 \quad 1)$ $$H\underline{v}^t = \begin{pmatrix} 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{pmatrix} \begin{pmatrix} 0 \\ 1 \\ 1 \\ 0 \\ 1 \\ 0 \\ 0 \\ 0 \\ 1 \\ 1 \end{pmatrix} = \begin{pmatrix} 0 \\ 1 \\ 0 \\ 0 \\ 0 \end{pmatrix} \neq \underline{0} \longrightarrow \text{Perform next iteration}$$

Syndrome check

US 10,200,063 B2

MEMORY CONTROLLER, SEMICONDUCTOR MEMORY SYSTEM AND OPERATING METHOD THEREOF

CROSS-REFERENCE TO RELATED APPLICATIONS

The present application claims priority of Korean Patent Application. No, 10-2016-0102985, filed on Aug. 12, 2016, which is incorporated herein by reference in its entirety.

BACKGROUND

1. Field

Various exemplary embodiments of the present invention relate to a memory controller, a semiconductor memory system and an operating method thereof.

2. Description of the Related Art

In general, semiconductor memory devices are classified into volatile memory devices, such as Dynamic Random Access Memory (DRAM) and Static RAM (SRAM), and non-volatile memory devices, such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.

Volatile memory devices lose their stored data when their power supplies are interrupted, whereas non-volatile memory devices retain their stored data even when their power supplies are interrupted. Non-volatile flash memory devices are widely used as storage mediums in computer systems because of their high program speed, low power consumption and large data storage capacity.

In non-volatile memory devices, especially in flash memory devices, the data state of each memory cell depends on the number of bits that the memory cell can program. A memory cell storing 1-bit data per cell is called a single-bit cell or a single-level cell (SLC). A memory cell storing 2-bit data per cell is called a multi-bit cell, a multi-level cell (MLC) or a multi-state cell. And a memory cell storing 3-bit data per cell is called a triple-level cell (TLC). Employing the MLC and TLC are advantageous for achieving higher integration levels as compared to using SLCs. However, as the number of bits programmed in each memory cell increases, the reliability decreases and the read failure rate increases.

For example, when k bits are to be programmed in a memory cell, one of $2^k$ threshold voltages is formed in the memory cell at any given time. Due to minute differences between the electrical characteristics of memory cells, the threshold voltages of memory cells programmed for the same data form threshold voltage distributions. Threshold voltage distributions correspond to $2^k$ data values corresponding to k-bit information, respectively.

However, a voltage window available for the various threshold voltage distributions is finite. Therefore, as the value of k increases, the distance between consecutive threshold voltage distributions decreases and the probability that neighbouring threshold voltage distributions may overlap also increases. When two neighbouring threshold voltage distributions overlap, read data may include error bits.

FIG. 1 is a threshold voltage distribution schematically illustrating program and erase states of a 3-bit TLC non-volatile memory device.

FIG. 2 is a threshold voltage distribution schematically illustrating program and erase states due to characteristic deterioration of the 3-bit TLC non-volatile memory device.

In a TLC non-volatile memory device, e.g., a TLC flash memory device capable of storing 3-bit data in a single memory cell, the memory cell may have one of $2^3$ threshold voltage distributions.

Threshold voltages of memory cells programmed for the same data form a threshold voltage distribution due to characteristic differences between memory cells. In the 3-bit TLC non-volatile memory device as illustrated in FIG. 1, threshold voltage distributions are formed in correspondence with the data states including 7 program states 'P1' to 'P7' and an erase state 'E'. FIG. 1 shows an ideal case in which threshold voltage distributions do not overlap and have sufficient read voltage margins therebetween.

Referring to the flash memory example of FIG. 2, the memory cell may experience charge losses in which electrons trapped at a floating gate or tunnel oxide film are discharged over time. Such charge loss may accelerate when the tunnel oxide film deteriorates because of iterative program and erase operations. Charge losses may result in a decrease in the threshold voltages of memory cells. For example, as illustrated in FIG. 2, the threshold voltage distributions my be shifted left due to charge losses.

Further, program disturbances, erase disturbances and/or back pattern dependencies may cause increases in the threshold voltages. As the characteristics of memory cells deteriorate, neighbouring threshold voltage distributions may overlap, as illustrated in FIG. 2.

Once neighbouring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap, a memory cell that has the third program state 'P3' may be erroneously determined to have the second program state 'P2'. In short, when the neighbouring threshold voltage distributions overlap as illustrated in FIG. 2, read data may include a significant number of errors.

What is therefore required is a scheme for reliably and quickly reading data stored in memory cells of a semiconductor memory device, especially in multi-level memory cells of a highly-integrated memory device.

SUMMARY

Various embodiments of the present invention are directed to a memory controller, a semiconductor memory system and an operating method thereof capable of reliably and quickly reading data stored in memory cells of a semiconductor memory device, especially, in multi-level memory cells of a highly-integrated memory device.

In accordance with an embodiment of the present invention, an operation method of a memory controller may include: reading a second data from memory cells when a hard decision error correction decoding operation based on a first data read from the memory cells fails; calculating a Log Likelihood Ratio (LLR) of each bit-data included in the first data by using the first data and the second data; and performing a soft decision error correction decoding operation based on the LLR, wherein the memory cells include a first memory cell and a second memory cell adjacent to the first memory cell, wherein the first data includes first-bit-data read from the first memory cell and the second memory cell, wherein the second data includes second-bit-data read from the first memory cell and the second memory cell, and wherein the LLR is a LLR of the first-bit-data read from the first memory cell calculated based on the first bit and a second bit read from the first memory cell and a first bit and a second bit read from the second memory cell.

Preferably, each of the memory cells stores n-bit-data, wherein each of the first-bit-data corresponds to an i-th-bit-data of the n-bit-data stored in each of the memory cells, wherein each of the second-bit-data corresponds to bit-data other than the i-th-bit-data of the n-bit-data stored in each of the memory cells, wherein the n is an integer greater than 2, and wherein the i is an integer greater than 1.

Preferably, the i-th-bit-data corresponds to a most significant bit (MSB) data of the n-bit-data.

Preferably, the n is 2.

Preferably, the first memory cell and the second memory cell are placed on the same word line.

Preferably, the second memory cell is placed next to the first memory cell on, the same word line.

Preferably, the first memory cell and the second memory cell are placed on the same bit line.

Preferably, the second memory cell is placed next to the first memory cell on the same bit line.

Preferably, the LLR is an LLR of a conditional probability that the first-bit-data stored in the first memory cell has a value of "1" to a conditional probability that the first-bit-data stored in the first memory cell has a value of "0" according to statuses of the first-bit-data and the second-bit-data read from the memory cells.

Preferably, the LLR is a LLR of a conditional probability that the first and second data read from the first memory cell are in a certain status and the first and second data read from the second memory cell are in a certain status when the first-bit-data stored in the first memory cell has a value of "0" to a conditional probability that the first and second data read from the first memory cell are in a certain status and the first and second data read from the second memory cell are in a certain status when the first-bit-data stored in the first memory cell has a value of "1", and wherein the certain status is one of an erase status and one or more of program statuses.

In accordance with an embodiment of the present invention, a memory controller may include: a first means suitable for reading a second data from memory cells when a hard decision error correction decoding operation based on a first data read from memory cells fails; a second means suitable for calculating a Log Likelihood Ratio (LLR) of each bit-data included in the first data by using the first data and the second data; and a third means suitable for performing a soft decision error correction decoding operation based on the LLR, wherein the memory cells include a first memory cell and a second memory cell adjacent to the first memory cell, wherein the first data includes first-bit-data read from the first memory cell and the second memory cell, wherein the second data includes second-bit-data read from the first memory cell and the second memory cell and wherein the LLR is a LLR of the first-bit-data read from the first memory cell calculated based on the first bit and a second bit read from the first memory cell and a first bit and a second bit read from the second memory cell.

Preferably, each of the memory cells stores n-bit-data, wherein each of the first-bit-data corresponds to an i-th-bit-data of the n-bit-data stored in each of the memory cells, wherein each of the second-bit-data corresponds to bit-data other than the i-th-bit-data of the n-bit-data stored in each of the memory cells, wherein the n is an integer greater than 2, and wherein the i is an integer greater than 1.

Preferably, the i-th-bit-data corresponds to a most significant bit (MSB) data of the n-bit-data.

Preferably, the n is 2.

Preferably, the first memory cell and the second memory cell are placed on the same word line.

Preferably, the second memory cell is placed next to the memory cell on the same word line.

Preferably, the first memory cell and the second memory cell are placed on the same bit line.

Preferably, the second memory cell is placed next to the first memory cell on the same bit line.

Preferably, the LLR is an LLR of a conditional probability that the first-bit-data stored in the first memory cell has a value of "1" to a conditional probability that the first-bit-data stored in the first memory cell has a value of "0" according to statuses of the first-bit-data and the second-bit-data read from the memory cells.

Preferably, the LLR is a LLR of a conditional probability that the first and second data read from the first memory cell are in a certain status and the first and second data read from the second memory cell are in a certain status when the first-bit-data stored in the first memory cell has a value of "0" to a conditional probability that the first and second data read from the first memory cell are in a certain status and the first and second data read from the second memory cell are in a certain status when the first-bit-data stored in the first memory cell has a value of "1", and wherein the certain status is one of an erase status and one or more of program statuses.

In accordance with an embodiment of the present invention, an operation method of a memory controller may include: reading a second data from respective memory cells when a hard decision error correction decoding based on a first data read from respective memory cells fails; and performing a soft decision error correction decoding based on first and second data read from the respective memory cells and first and second data read from respective neighbouring memory cells of the respective memory cells by using a Log Likelihood Ratio (LLR) of the first data read from the respective memory cells.

Preferably, the respective memory cells store a third data of n bits, wherein the first data corresponds to an i-th bit of the third data, wherein the second data corresponds to bits of the third data other than the i-th bit, and wherein each of the n and the i is an integer greater than 1.

Preferably, the first data corresponds to a most significant bit of the third data.

Preferably, the respective memory cells store the third data of 2 bits.

Preferably, the respective neighbouring memory cells of the respective memory cells and the respective memory cells correspond to the same word line.

Preferably, the respective neighbouring memory cells of the respective memory cells are adjacent to the respective memory cells with reference to the word line.

Preferably, the respective neighbouring memory cells of the respective memory cells and the respective memory cells correspond to the same bit line.

Preferably, the respective neighbouring memory cells of the respective memory cells are adjacent to the respective memory cells with reference to the bit line.

Preferably, the log likelihood ratio of the first data is a log likelihood ratio of a conditional probability that the i-th bit of the third data stored in the respective memory cells has a value of "0" to a conditional probability that the i-th bit of the third data stored in the respective memory cells has a value of "1" according to the first and second data read from the respective memory cells and the first and second data read from the respective neighbouring memory cells of the respective memory cells.

Preferably, the log likelihood ratio of the first data is a log likelihood ratio of a conditional probability that the first and second data are read from the respective memory cells and the first and second data are read from the respective neighbouring memory cells of the respective memory cells when the i-th bit of the third data stored in the respective memory cells has a value of "0" to a conditional probability that the first and second data are read from the respective memory cells and the first and second data are read from the respective neighbouring memory cells of the respective memory cells when the i-th bit of the third data stored in the respective memory cells has a value of "1".

In accordance with an embodiment of the present invention, a memory controller may include; a first means suitable for reading a second data from respective memory cells when a hard decision error correction decoding based on a first data read from respective memory cells fails; and a second means suitable for performing a soft decision error correction decoding based on first and second data read from the respective memory cells and first and second data read from respective neighbouring memory cells of the respective memory cells by using a Log Likelihood Ratio (LLR) of the first data read from the respective memory cells.

Preferably, the respective memory cells store a third data of n bits, wherein the first data corresponds to an i-th bit of the third data wherein the second data corresponds to bits of the third data other than the i-th bit, and wherein each of the n and the i is an integer greater than 1.

Preferably, the first data corresponds to a most significant bit of the third data.

Preferably, the respective memory cells store the third data of 2 bits.

Preferably, the respective neighbouring memory cells of the respective memory cells and the respective memory cells correspond to the same word line.

Preferably, the respective neighbouring memory cells of the respective memory cells are adjacent to the respective memory cells with reference to the word line.

Preferably, the respective neighbouring memory cells of the respective memory cells and the respective memory cells correspond to the same bit line.

Preferably, the respective neighbouring memory cells of the respective memory cells are adjacent to the respective memory cells with reference to the bit line.

Preferably, the log likelihood ratio of the first data is a log likelihood ratio of a conditional probability that the i-th bit of the third data stored in the respective memory cells has a value of "0" to a conditional probability that the i-th bit of the third data stored in the respective memory cells has a value of "1" according to the first and second data read from the respective memory cells and the first and second data read from the respective neighbouring memory cells of the respective memory cells.

Preferably, the log likelihood ratio of the first data is a log likelihood ratio of a conditional probability that the first and second data are read from the respective memory cells and the first and second data are read from the respective neighbouring memory cells of the respective memory cells when the i-th bit of the third data stored in the respective memory cells has a value of "0" to a conditional probability that the first and second data are read from the respective memory cells and the first and second data are read from the respective neighbouring memory cells of the respective memory cells when the i-th bit of the third data stored in the respective memory cells has a value of "1".

In accordance with various embodiments of the present invention, data stored in memory cells of a semiconductor memory device may be quickly read.

BRIEF DESCRIPTION OF THE DRAWINGS

The above and other features and advantages of the present invention will become more apparent to those skilled in the art to which the present invention pertains by the following detailed description with reference to the attached drawings in which:

FIG. 4A is a more detailed block diagram illustrating the semiconductor memory system of FIG. 3.

FIG. 7 is a schematic diagram illustrating an LDPC code.

FIG. 8 is a schematic diagram illustrating a syndrome check process according to an LDPC decoding operation.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the present invention to those skilled in the art. The scope of the present invention will be understood through the claims of the present invention.

It is noted that the drawings are not necessarily to scale and, in some instances, proportions may have been exaggerated in order to more clearly illustrate the various elements of the embodiments.

Also, in the following description, numerous specific details are set forth in order to provide a thorough understanding of the present invention. The present invention may be practiced without some or ail of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, various embodiments of the present invention will be described in detail with reference to the attached drawings.

Figure 3:
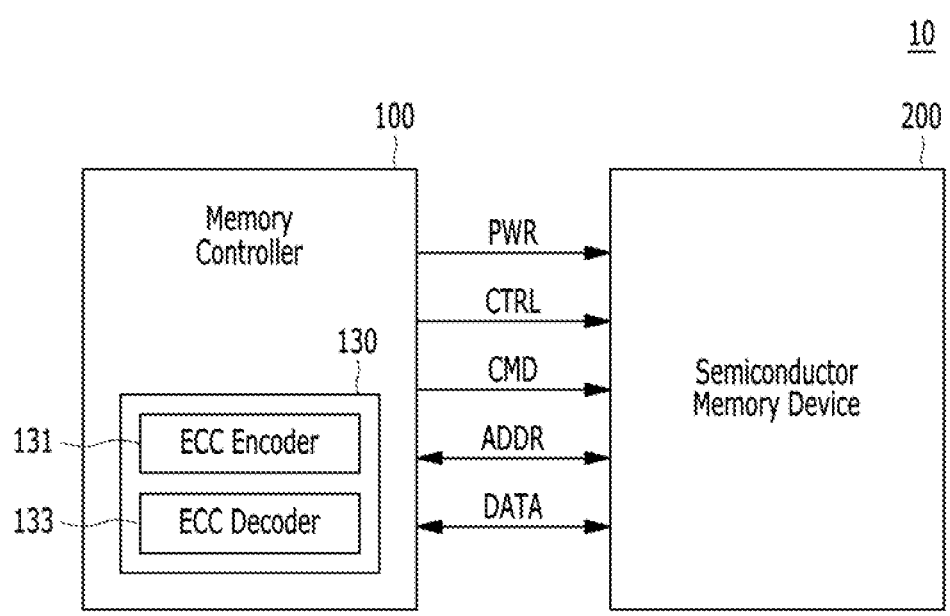
FIG. 3 is a block diagram schematically illustrating a semiconductor memory system in accordance with an embodiment of the present invention.

FIG. 3 is a block diagram schematically illustrating a semiconductor memory system 10 in accordance with an embodiment of the present invention.

FIG. 4A is a block diagram illustrating the semiconductor memory system 10 of FIG. 3 in further detail.

Figure 4B:
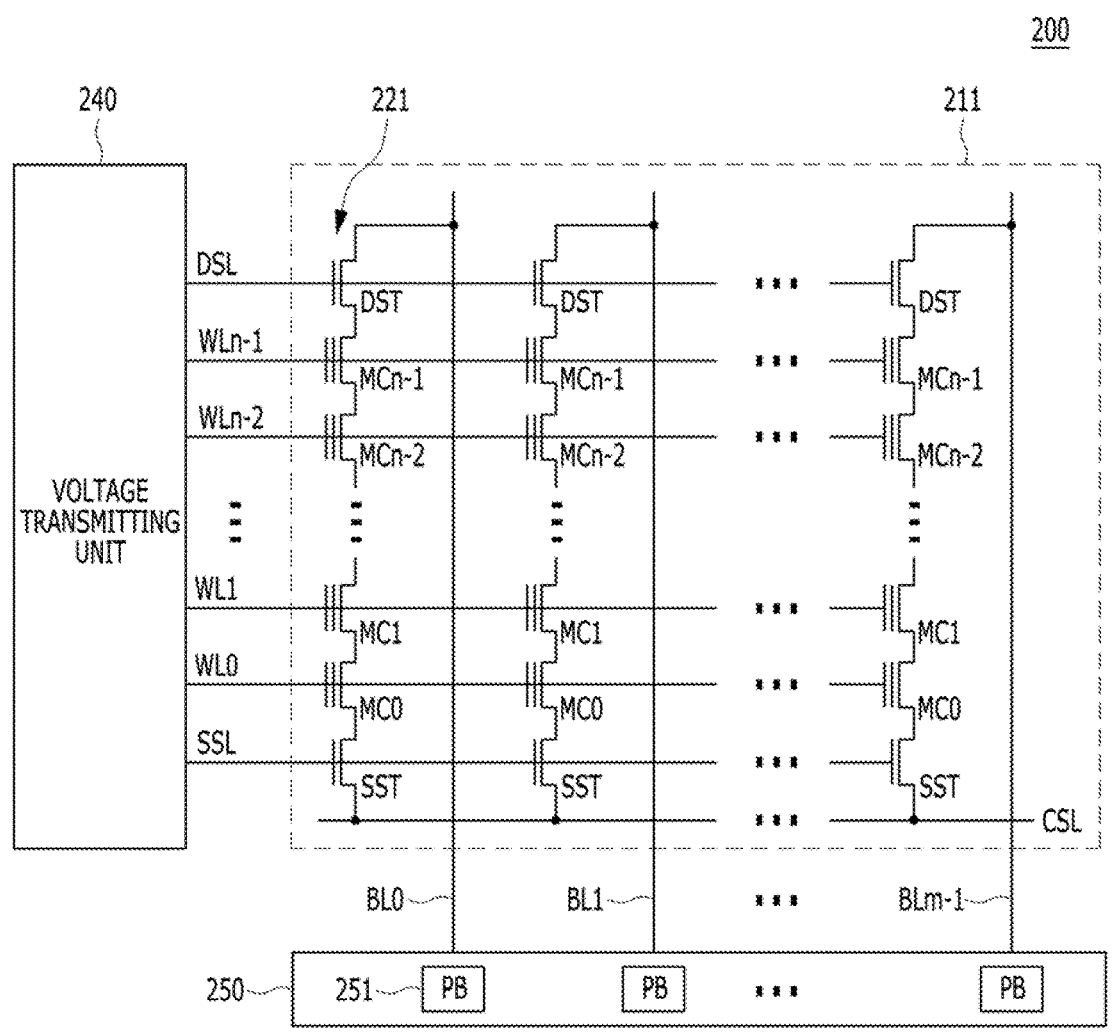
FIG. 4B is a circuit diagram illustrating an exemplary configuration of a memory block employed in the semiconductor memory system of FIG. 4A.

FIG. 4B is a circuit diagram illustrating an exemplary embodiment of a memory block 211 of FIG. 4A.

Referring to FIGS. 3 to 4B, the semiconductor memory system 10 may include a semiconductor memory device 200 and a memory controller 100 operatively coupled to the semiconductor memory device 200.

The semiconductor memory device 200 may perform one or more of an erase, a program, and a read operation under the control of the memory controller 100. The semiconductor memory device 200 may receive a command CMD, an address ADDR and data DATA through one or more input/output lines from the memory controller 100. The semiconductor memory device 200 may receive power PWR through a power line and a control signal CTRL through a control line from the memory controller 100. The control signal may include a command latch enable (CLE) signal, an address latch enable (ALE) signal, a chip enable (CE) signal, a write enable (WE) signal, a read enable (RE) signal and so on.

The memory controller 100 may control the overall operations of the semiconductor memory device 200. The memory controller 100 may include an ECC unit 130 for correcting error bits. The ECC unit 130 may include an ECC encoder 131 and an ECC decoder 133.

The ECC encoder 131 may perform an error correction encoding operation on data to be programmed into the semiconductor memory device 200 to output data to which parity bits are added. The encoded data with the parity bits may be stored in the semiconductor memory device 200.

The ECC decoder 133 may perform an error correction decoding operation on data read from the semiconductor memory device 200. The ECC decoder 133 may determine whether the error correction decoding operation is successful, and may output an instruction signal based on the determination result. The ECC decoder 133 may correct error bits of data using the parity bits generated by the LDPC encoding operation.

When the number of error bits exceeds the error correction capacity of the ECC unit 130, the ECC unit 130 may not correct the error bits, in this case, the ECC unit 130 may generate an error correction fail signal.

The ECC unit 130 may correct an error through a coded modulation such as a low-density parity-check (LDPC) code a Bose-Chaudhuri-Hocquenghem (BCH) code, a turbo code, a Reed-Solomon (RS) code a convolution code, a Recursive Systematic Code (RSC) a Trellis-Coded Modulation (TCM), a Block Coded Modulation (BCM), and so on. The FCC unit 130 may include all circuits, systems, or devices for error correction.

In accordance with an embodiment of the present invention, the FCC unit 130 may perform an error bit correcting operation using hard decision read data and soft decision read data.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The SSD may store data in the semiconductor memory device 200. When the semiconductor memory system 10 is used in an SSD, the operation speed of a host (not shown) which may be coupled to the semiconductor memory system 10 may be improved significantly.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro) a secure digital (SD) card, a mini secure digital (mini D) card, a micro secure digital (micro D) card, a secure digital high capacity (SDHC), and a universal flash storage (UFS).

For another example, the semiconductor memory system 10 may be provided as one of various elements comprising an electronic device such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or elements devices of a computing system.

Referring to FIG. 4A, according to an embodiment, the memory controller 100 may include besides the ECC unit 130, a storage unit 110, a CPU 120, a host interface 140, a memory interface 150 and a system bus 160. The storage unit 110 may operate as a working memory of the CPU 120. The storage unit 110 may store a probability table as disclosed below.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may interface with the semiconductor memory device 200. The CPU 120 may perform various control operations.

The semiconductor memory device 200, according to an embodiment, may include a memory cell array 210, a control circuit 220, a voltage supply unit 230, a voltage transmitting unit 240, a read/write circuit 250, and a column selection unit 260.

The memory cell array 210 may include a plurality of memory blocks 211. Data including user data may be stored in the memory blocks 211.

Referring to FIG. 4B, each of the memory blocks 211 may include a plurality of cell strings 221 electrically coupled to a plurality of corresponding bit lines BL0 to BLm−1, respectively. Each cell string 221 may include one or more drain selection transistors DST and one or more source selection transistors SST. A plurality of memory cells or memory cell transistors may be serially coupled between the drain and the source selection transistors DST and SST. Each of the memory cells MC0 to MCn−1 may be preferably formed of a multi-level cell (MLC) storing data information of multiple bits in each cell.

FIG. 4B exemplarily illustrates a memory block 211 comprising a plurality of NAND-type flash memory cells. However, the memory block 211 of the semiconductor memory device 200 may not be limited in this way. For example, the memory block 211 may comprise a plurality of NOR-type flash memory cells, or a plurality of hybrid flash memory cells in which two or more types of memory cells are combined. In an embodiment employing a NAND flash memory, a controller may be embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operations related to program, erase, and read operations of the semiconductor memory device 200.

The voltage supply unit 230 may provide word line voltages, for example, a program voltage, a read voltage, and a pass voltage, to the respective word lines as may be needed according to an operation mode, and may provide a voltage to be supplied to a bulk, for example, a well region in which the memory cells are formed. A voltage generating operation of the voltage supply circuit 230 may be performed under the control of the control circuit 220.

The voltage supply unit 230 may generate a plurality of variable read voltages corresponding to the various threshold voltage distributions of the memory cells for generating a plurality of read data.

The voltage transmitting unit 240 may select one of the memory blocks 211 or sectors of the memory cell array 210, and may select one of the word lines of the selected memory block under the control of the control circuit 220. The voltage transmitting unit 240 may provide the word line voltage generated from the voltage supply circuit 230 to selected word lines or non-selected word lines under the control of the control circuit 220. For example, the voltage transmitting unit 240 may transmit one of the plurality of read voltages to a selected word line of a selected memory block and a pass voltage to the unselected word lines of the selected memory block.

The read rite circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During a normal read operation, the column selection unit 260 may output the data read from the read/write circuit 250 to the outside, for example, to the memory controller 100, based on column address information. On the other hand, during a verification read operation, the read data may be provided to a pass/fail verification circuit (not illustrated) included in the semiconductor memory device 200, and may be used for determining whether a program operation of the memory cell succeeds.

During a program operation, the read/write circuit 250 may operate as a write driver for driving the bit lines according to data to be stored in the memory cell array 210. During a program operation, the read/write circuit 250 may receive the data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

Figure 5A:
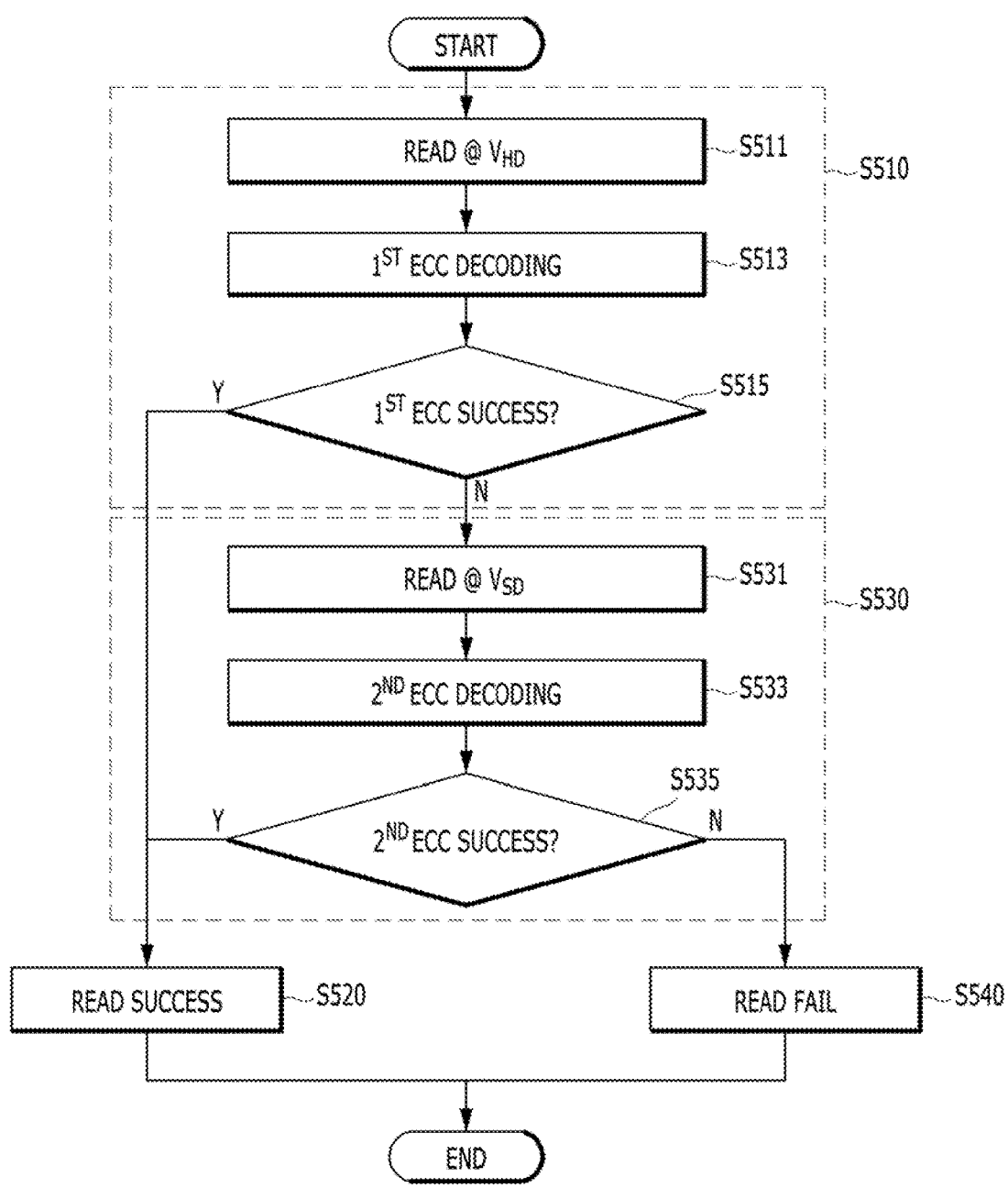
FIG. 5A is a flowchart illustrating an operation of a memory controller employed in the semiconductor memory system of FIG. 4A in accordance with an embodiment of the present invention.

FIG. 5A is a flowchart illustrating an operation of the memory controller 100 included in the semiconductor memory system 10.

Figure 5B:
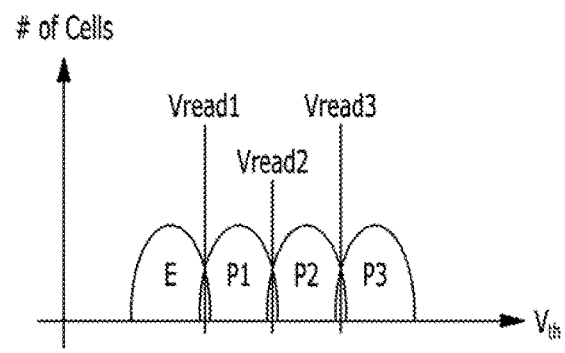
FIG. 5B is a threshold voltage distribution schematically illustrating distorted program and erase states due to characteristic deterioration of a 2-bit MLC non-volatile memory device.

FIG. 5B is a threshold voltage distribution schematically illustrating distorted program and erase states due to characteristic deterioration of a 2-bit MLC non-volatile memory device.

Referring to FIGS. 4A and 5A, the operation of the memory controller 100 may include first and second ECC decoding steps S510 and S530.

For example, the first ECC decoding step S510 may be a step of performing a hard decision ECC decoding operation to data which are read from a memory cell of the semiconductor memory device 200 according to the hard decision read voltage $V_{HD}$. The first ECC decoding step S510 may include steps S511, S513 and S515. The read data from the memory cell may be i-th data among n-bit data stored in the memory cell. The "n" and "i" may be integers greater than 1.

For example, the second ECC decoding step S530 may be a step of performing a soft decision ECC decoding operation to the i-th data when the hard decision ECC decoding to the i-th data at the first ECC decoding step S510 finally fails. The second ECC decoding step S530 may include steps S531, S533 and S535.

At step S511 of the hard decision read step, the memory controller 100 may read the hard decision read data or the codeword from the semiconductor memory device 200 according to the predetermined hard decision read voltages $V_{HD}$. The memory controller 100 may provide a read command and an address to the semiconductor memory device 200. The semiconductor memory device 200 may read the hard decision read data therefrom according to the predetermined hard decision read voltages $V_{HD}$ in response to the read command and the address and provide them to the memory controller 100.

Referring to FIG. 5B, when the memory cell of the semiconductor memory device 200 is an MLC the predetermined hard decision read voltages $V_{HD}$ may be first to third read voltages Vread1, Vread2 and Vread3. For example, the first and third read voltages Vread1 and Vread3 may be used to read a Most Significant Bit (MSB) between 2 bits stored in the memory cell, and the second read voltage Vread2 may be used to read a Least Significant Bit LSB) between 2 bits stored in the memory cell.

At step S513, the ECC unit 130 may perform the hard decision ECC decoding operation as the first ECC decoding operation. The ECC unit 130 may perform the hard decision ECC decoding operation to the hard decision read data which are read from the semiconductor memory device 200 by using the error correction code.

At step S515, the ECC unit 130 may determine whether the hard decision ECC decoding operation succeeds or fails. That is, at step S515, it may be determined whether an error of the hard decision read data is corrected. For example, the ECC unit 130 may determine whether an error of the hard decision read data is corrected by using the hard decision read data, to which the hard decision ECC decoding is performed at step S513, and a Parity Check Matrix. For example, when the product result of the parity check matrix and the hard decision read data is a zero vector ('0'), it may be determined that the hard decision read data is corrected. On the other hand, when the product result of the parity check matrix and the hard decision read data is not the zero vector ('0'), it may be determined that the hard decision read data is not corrected.

When it is determined that the hard decision ECC decoding operation of step S513 is successful as the result of the determination of step S515, the ECC unit 130 may end the error correction decoding operation. The hard decision read data, to which the hard decision ECC decoding operation is performed at step S513, may be now the error-corrected data and may be provided externally or used in the memory controller 100.

When it is determined that the hard decision ECC decoding operation of step S513 has failed as the result of the determination of step S515, the ECC unit 130 may perform the second ECC decoding step S530.

At step S531 of the soft decision read step, the ECC unit 130 may read data from a memory cell of the semiconductor memory device 200 according to the soft decision read voyages $V_{SD}$ and may calculate the soft decision read data for the hard decision read data read at step S511 by determining a status of the memory cell. The ECC unit 130 may calculate the soft decision read data for the hard decision read data which are read from the memory cell according to the status of the memory cell and neighbouring memory cells thereof by using a probability table stored in the storage unit 110.

Referring to FIG. 5B, the soft decision read voltages $V_{SD}$ may be the ones other than used at step S511 among the first to third read voltages Vread1, Vread2 and Vread3. For example, when the MSB is read from the memory cell at step S511, the ECC unit 130 may read the LSB according to the second read voltage Vread2 at step S531. For example, when the LSB is read from the memory cell at step S511, the ECC unit 130 may read the MSB according to the first and third read voltages Vread1 and Vread3 at step S531. That is, the soft decision read voltages $V_{SD}$ used at step S531 may be the read voltages other than the hard decision read voltages $V_{HD}$ used at step S511. Here, a soft decision read data may be a Log Likelihood Ratio (LLR) for a hard decision read data.

The probability table may include an error probability. The error probability may represent a probability that the hard decision read data read from a read memory cell is different from the i-th bit of data stored in the read memory cell according to statuses of data stored in the read memory cell and the respective neighbouring memory cells thereof. Each status of data stored in the read memory cell and the respective neighbouring memory cells thereof may be one of the program status and the erase status.

The neighbouring memory cells of the read memory cell may be adjacent to the read memory cell. For example, when the read memory cell is controlled by a word line WL1 and a bit line BL1, the neighbouring memory cells may be controlled by word lines WL0, WL1 and WL2 and bit lines BL0, BL1 and BL2. Hereinafter, it is assumed for simplification of description that the read memory cell and the neighbouring memory cells thereof are controlled by the same word line. For example, when the read memory cell is controlled by a word line WL1 and a bit line BL1, the neighbouring memory cells may be controlled by the word line WL1 and bit lines BL0 and BL2. That is, the neighbouring memory cells of the read memory cell may be disposed at left and right of (or below and above) the read memory cell on a word line or on a bit line, which will not limit the scope of the present invention.

Hereinafter, described will be a first scheme that the ECC unit 130 at step S531 calculates the soft decision read data based on the hard decision read data read from the semiconductor memory device 200.

When the memory cell of the semiconductor memory device 200 stores n-bit data, the error probability of the i-th bit of data stored in the read memory cell may be represented by equation 1 as follows.

$$P = Pr(y \neq x | X_r \text{ and } X_n) \qquad \text{[Equation]}$$

In equation 1, "P" may represent the error probability that the hard decision read data read from the read memory cell is different from the i-th bit of data stored in the read memory cell according to statuses of data stored in the read memory cell and the respective neighbouring memory cells thereof, "y" may represent the hard decision read data read from the read memory cell "x" may represent the i-th bit of data stored in the read memory cell, "$X_r$" may represent the status of data stored in the read memory cell, and "$X_n$" may represent the status of data stored in the neighbouring memory cell of the read memory cell.

Following table 1 is an example of the probability table including the error probability of the MSB of the read memory cell when each of the read memory cell and the neighbouring memory cells thereof stores 2-bit data (i.e., when they are MLCs).

TABLE 1

| $X_{n1}$ | $X_r$ | $X_{n2}$ | P of MSB |
|---|---|---|---|
| P3 | E | P3 | $1.26 \times 10^{-2}$ |
| E | P1 | E | $1.44 \times 10^{-2}$ |
| P3 | P2 | P3 | $1.48 \times 10^{-2}$ |
| E | P3 | E | $1.79 \times 10^{-3}$ |
| P3 | P3 | P3 | $6.35 \times 10^{-4}$ |

In table 1, "P1" to "P3" may indicate that the data stored in a memory cell is in first to third program statuses, respectively, and "E" may indicate that the data stored in a memory cell is in the erase status.

Referring to table 1, when the data stored in the read memory cell is in the erase state "E" and the data stored in the neighbouring memory cells are in the third program status "P3", the error probability that the MSB read from the read memory cell is not correct is "$1.26 \times 10^{-2}$". In table 1 "$X_{n1}$" may exemplarily represent the neighbouring memory cell disposed at left of the read memory cell, and "$X_{n2}$" may exemplarily represent the neighbouring memory cell disposed at right of the read memory cell.

Following table 2 is an example of the probability table including the error probability of the LSB of the read memory cell when each of the read memory cell and the neighbouring memory cells thereof stores 2-bit data (i.e., when they are MLCs).

TABLE 2

| $X_{n1}$ | $X_r$ | $X_{n2}$ | P of LSB |
|---|---|---|---|
| P3 | E | P3 | $4.60 \times 10^{-3}$ |
| E | P1 | E | $4.44 \times 10^{-3}$ |
| P3 | P2 | P3 | $4.21 \times 10^{-3}$ |
| E | P3 | E | $1.20 \times 10^{-3}$ |
| P3 | P3 | P3 | $4.58 \times 10^{-4}$ |

The ECC unit 130 may calculate the soft decision read data based on the hard decision read data read from the semiconductor memory device 200 by using the probability table.

Particularly, the ECC unit 130 may calculate the soft decision read data, that is, the Log Likelihood Ratio (LLR) for the hard decision read data by using equation 2 as follows.

$$LLR = \log\frac{P(x=1 | Y_r \text{ and } Y_n)}{P(x=0 | Y_r \text{ and } Y_n)} \quad \text{[Equation 2]}$$

In equation 2, "LLR" may represent the log likelihood ratio (i.e., the soft decision read data for the hard decision read data), "x" may represent the i-th bit of data stored in the read memory cell, "$Y_r$" may represent the status of the data read from the read memory cell, and "$Y_n$" may represent the status of the data read from the neighbouring memory cell of the read memory cell.

According to equation 2, a positive LLR may indicate a relatively higher probability that the i-th bit of the data stored in the read memory cell has a value of "1", and a negative LLR may indicate a relatively higher probability that the i-th bit of the data stored in the read memory cell has a value of "0". Further, according to equation 2, as the absolute value of the LLR becomes greater, the probability that the i-th bit of the data stored in the read memory cell has a value of "1" or "0" becomes more reliable.

When the statuses of data read from the read memory cell and the neighbouring memory cells thereof in equation 2 are given, the LLR of equation 2 may be approximated by the probability table and equation 3 as follows since the probability table does not include the probability that the i-th bit of the data stored in the read memory cell has a value of "1" or "0".

$$LLR \cong \log\frac{P(y | x=1, X_r \text{ and } X_n)}{P(y | x=0, X_r \text{ and } X_n)} \quad \text{[Equation 3]}$$

In equation 3, "y" may represent the hard decision read data read from the read memory cell, and "x" may represent the i-th bit of data stored in the read memory cell.

Referring to equations 2 and 3, "$Y_n$" may be approximated to "$X_n$" and "$Y_r$" may be approximated to "$X_r$", Therefore, the LLR of equation 2 may be calculated through equation 3. Further, the conditional probability of equation 3 may be calculated through equation 1 and the probability table. Therefore, the LLR of equation 2 may be calculated through equation 3 and the probability table.

As described above, the ECC unit 130 at step S531 may calculate the LLR of the i-th bit of data stored in the read memory cell (Le, the soft decision read data for the hard decision read data) through equations 1 to 3 and the probability table (e.g. tables 1 and 2).

To sum up the first scheme described above, the LLR of each bit of data stored in a read memory cell may be calculated according to the status of data read from the read memory cell and neighbouring memory cells thereof.

Hereinafter, described will be a second scheme that the ECC unit 130 at step S531 calculates the soft decision read data based on the hard decision read data read from the semiconductor memory device 200.

When the memory cell of the semiconductor memory device 200 stores n-bit data, the error probability of data read from the read memory cell may be represented by equation 4 as follows.

$$P = P(Y_r | X_r \text{ and } X_n) \quad \text{[Equation 4]}$$

In equation 4, "P" may represent the probability that the status of data read from a read memory cell is "$Y_r$" according to the statuses of data stored in the read memory cell and the neighbouring memory cells thereof, "$Y_r$" may represent one of the program status and the erase status as the status of data read from the read memory cell, "$X_r$" may represent the status of data stored in a memory cell, and "$X_n$" may represent the status of data stored in the neighbouring memory cell of the read memory cell.

Following table 3 is an example of the probability table including a status probability of data read from the read memory cell when each of the read memory cell and the neighbouring memory cells thereof stores 2-bit data (i.e., when they are MLCs).

TABLE 3

| $X_{n1}$ | $X_r$ | $X_{n2}$ | $Y_r$ | P |
|---|---|---|---|---|
| P3 | E | P3 | E | $9.88 \times 10^{-1}$ |
|  |  |  | P1 | $1.26 \times 10^{-2}$ |
|  |  |  | P2 | $2.42 \times 10^{-6}$ |
|  |  |  | P3 | 0 |

TABLE 3-continued

| $X_{n1}$ | $X_r$ | $X_{n2}$ | $Y_r$ | P |
|---|---|---|---|---|
| E | P1 | E | E | 8.63 × 10⁻³ |
|   |   |   | P1 | 9.86 × 10⁻¹ |
|   |   |   | P2 | 5.76 × 10⁻³ |
|   |   |   | P3 | 0 |

For example referring to table 3, when the data stored in the read memory cell is in the erase state "E" and the data stored in the neighbouring memory cells are in the third program status "P3", the probability that the data read from the read memory cell is in the erase status "E" is "9.88× 10⁻¹" and the probability that the data read from the read memory cell is in the first program status "P1" is "1.26× 10⁻²". Therefore, the probability that the status of the data read from the read memory cell is the same as the status of the data stored in the read memory cell is approximately 99%.

Phe ECC unit 130 may calculate the soft decision read data based on the hard decision read data read from the semiconductor memory device 200 by using the probability table.

Particularly, the ECC unit 130 may calculate the soft decision read data, that is, the Log Likelihood Ratio (LLR) for the hard decision read data by using equation 5 as follows.

$$LLR = \log \frac{P(Y_r \text{ and } Y_n | x = 0)}{P(Y_r \text{ and } Y_n | x = 1)} \quad \text{[Equation 5]}$$

In equation 5, "LLR" may represent the log likelihood ratio (i.e., the soft decision read data for the hard decision read data) of the i-th bit of data stored in a read memory cell, "x" may represent the i-th bit of data stored in the read memory cell, "$Y_r$" may represent the status of the data read from the read memory cell, and "$Y_n$" may represent the status of the data read from the neighbouring memory cell of the read memory cell.

Referring to equation 5, the LLR may be the log likelihood ratio of the probability that the status of the data read from the read memory cell is "$Y_r$" and the status of the data read from the neighbouring memory cell thereof is "$Y_n$" when the i-th bit of data stored in the read memory cell has a value of "0" to the probability that the status of the data read from the read memory cell is "$Y_r$" and the status of the data read from the neighbouring memory cell thereof is "$Y_n$" when the i-th bit of data stored in the read memory cell has a value of "1". Each of "$Y_r$" and "$Y_n$" may be one of the program status and the erase status.

Following equation 6 may represent a probability equation for calculating the LLR of equation 5.

$$P(Y_r \text{ and } Y_n | X_r) = \quad \text{[Equation 6]}$$
$$\left(\frac{1}{N_s}\right)^{N_c} \times P(Y_r | X_r \text{ and } X_n) \times \Pi\{P(Y_n | X_n \text{ and } X_{nn})\}$$

In equation 6, $P(Y_r \text{ and } Y_n | X_r)$ may represent the probability that the statuses of data read from the read memory cell and the neighbouring memory cells are respectively one of "$Y_r$" and "$Y_n$" when the status of the data stored in the read memory cell is given as "$X_r$". In equation 6, "$N_s$" may represent a number of statuses that a memory cell can have, and may be 4 in this example of the MLC. In equation 6, "$N_C$" may represent a number of the read memory cell, the closest neighbouring memory cells of the read memory cell, and second-closest neighbouring memory cells of the read memory cell, and may be 5 since the number of the read memory cells is 1, the number of the closest neighbouring memory cells of the read memory cell is 2, and the number of the second-closest neighbouring memory cells of the read memory cell are 2. In equation 6, $P(Y_n | X_n \text{ and } X_{nn})$ may represent the probability that the status of the data read from the neighbouring memory cell is "$Y_n$" according to the statuses of the data stored in the closest neighbouring memory cells and the second-closest neighbouring memory cells. The probability $P(Y_n | X_n \text{ and } X_{nn})$ may be multiplied in equation 6 as many times as a number of the closest neighbouring memory cells. In this case, where the number of the closest neighbouring memory cells of the read memory cell is 2, the probabilities $P(Y_n | X_n \text{ and } X_{nn})$ for each of the 2 closest neighbouring memory cells may be calculated and multiplied in equation 6. In equation 6, "$Y_{nn}$" may be the status of the data read from the second-closest neighbouring memory cell of the read memory cell, and may be one of the program status and the erase status.

The probabilities $P(Y_r | X_r \text{ and } X_n)$ and $P(Y_n | X_n \text{ and } X_n)$ of equation 6 may be calculated by referring to equation 4 and table 3.

As described above, the ECC unit 130 at step S531 may calculate the LLR of the i-th bit of data stored in the read memory cell (i.e., the soft decision read data for the hard decision read data) through equations 5 and 6 and the probability table (e.g., table 3).

To sum up the second scheme described above, the LLR of each bit of data stored in a read memory cell may be calculated according to the status of data read from the read memory cell and neighbouring memory cells thereof, which is similar to the first scheme.

As described above, the ECC unit 130 may calculate the LLR of the i-th bit of data stored in the read memory cell according to the status of the read memory cell and neighbouring memory cells thereof through one of the first and second schemes, and may perform the soft decision ECC decoding operation by using the calculated LLR. In another embodiment, the storage unit 110 may store into an LLR table the LLR, which is calculated through one of the first and second schemes, of the i-th bit of data stored in the read memory cell according to the status of the read memory cell and neighbouring memory cells thereof, and then the ECC unit 130 may perform the soft decision ECC decoding operation by using the LLR stored in the LLR table.

At step S533 the soft decision ECC decoding operation may be performed as the second ECC decoding operation. The soft decision ECC decoding operation may be performed based on the soft decision read data.

At step S535, it may be determined whether the soft decision ECC decoding operation succeeds or fails. That is, at step S535, it may be determined whether an error of the soft decision read data, to which the soft decision ECC decoding operation is performed at step S533, is corrected. For example, the memory controller 100 may determine whether an error of the soft decision read data is corrected by using the soft decision read data and the parity check matrix. For example, when product result of the parity check matrix and the soft decision read data is the zero vector ('0'), it may be determined that the soft decision read data is corrected. On the other hand, when product result of the parity check matrix and the soft decision read data is not the zero vector ('0'), it may be determined that the soft decision read data, to which the soft decision ECC decoding operation is performed, is not corrected.

The product process of the parity check matrix and the hard decision read data during the first ECC decoding step S510 may be the same as the product process of the parity check matrix and the soft decision read data during the second ECC decoding step S530.

When it is determined that the soft decision ECC decoding of step S533 is successful as the result of the determination of step S535, it may be determined at step S520 that the read operation according to soft decision read voltages $V_{SD}$ at step S531 is successful and the error correction decoding operation may end. The soft decision read data, to which the soft decision ECC decoding operation is performed at step S533, may be now the error-corrected data and may be provided externally or used in the memory controller 100.

When it is determined that the soft decision ECC decoding operation of step S533 has failed as the result of determination of step S535, it may be determined at step S540 that the process of step S531 finally fails and the error correction decoding operation may end.

Figure 6:
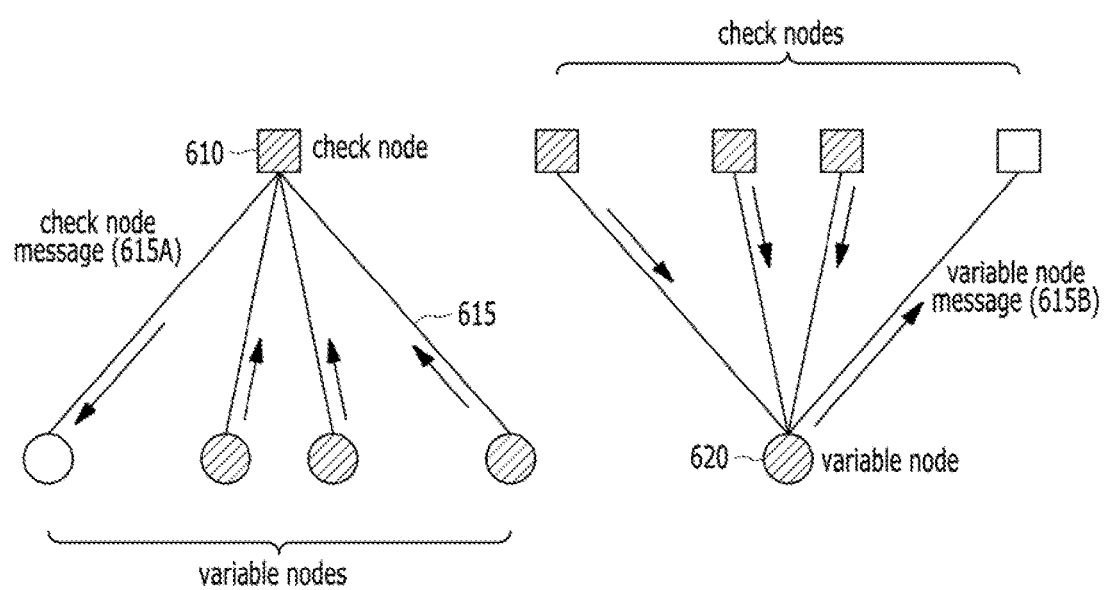
FIG. 6 is a Tanner graph illustrating an LDPC decoding operation.

FIG. 6 is a Tanner graph illustrating an LDPC decoding operation.

FIG. 7 is a schematic diagram illustrating an LDPC code.

FIG. 8 is a schematic diagram illustrating a syndrome check process according to the LDPC decoding operation.

An error correction code (ECC) is commonly used in storage systems. Various physical, phenomena occurring in storage devices result in noise effects that corrupt the stored information. Error correction coding schemes can be used for protecting the stored information against the resulting errors. This is done by encoding the information before storing the information in the memory device. The encoding process transforms the information bit sequence into a codeword by adding redundancy to the information. This redundancy can then be used in order to recover the information from the possibly corrupted codeword through a decoding process.

In iterative coding schemes, the code is constructed as a concatenation of several simple constituent codes and is decoded based on an iterative decoding algorithm by exchanging information between decoders receiving the simple constituent codes. Usually, the code can be defined using a bipartite graph or a Tanner graph describing interconnections between the constituent codes. In this case, the decoding operation can be viewed as an iterative message passing over the graph edges.

The iterative codes may include the low-density parity-check (LDPC) code. The LDPC code is a linear binary block code defined by a sparse parity-check matrix H.

Referring to FIG. 6, the LDPC code has a parity check matrix in which the number of is in each row and column is very small, and its structure can be defined by the Tanner graph including check nodes 610, variable nodes 620, and edges 615 connecting the check nodes 610 to the variable nodes 620. A value delivered from the check node 610 to the variable node 620 after check node processing becomes a check node message 615A, and a value delivered from the variable node 620 to the check node 610 after variable node processing becomes a variable node message 6156.

An initial value of the variable node 620 may be one of the hard decision read data and the soft decision read data.

A decoding process of the LDPC code may be performed by iterative decoding based on a 'sum-product' algorithm. A decoding method can be provided based on a suboptimal message-passing algorithm such as a 'min-sum' algorithm, which is a simplified version of the sum-product algorithm.

For example, referring to FIG. 7, the Tanner graph of the LDPC code may include 5 check nodes 610 representing parity check equations of the LDPC code, 10 variable nodes 620 representing code symbols, and edges 615 representing relationships between the check nodes 610 and the variable nodes 620. The edges 615 connect each check node 610 to the variable node 620 corresponding to a code symbol included in the parity check equations represented by the check nodes 610. FIG. 7 exemplarily illustrates a regular LDPC code in which the number of variable nodes 620 coupled to each of the check nodes 610 is fixed at 4 and the number of the check nodes 610 coupled to each of the variable nodes 620 is fixed at 2.

FIG. 8 shows a parity check matrix H corresponding to the Tanner graph. The parity check matrix H is similar to the graphic expression of the parity check equations. The parity check matrix H has the same number of 1s in each column. That is, each column of the parity check matrix H has two 1s corresponding to the connections between each of the variable nodes 620 and the check nodes 610. The parity check matrix H has the same number of 1s in each row, that is, each row has four 1s corresponding to the connections between each of the check nodes 610 and the variable nodes 620.

A process of decoding the LDPC code is performed by iterating a process of exchanging messages, which are generated and updated in each node, between the variable nodes 620 and the check nodes 610 in the Tanner graph. In this case, each node updates the messages based on the sum-product algorithm or a similar suboptimal algorithm.

For example, the LDPC decoding operation on the codeword may comprise a plurality of iterations, each of which includes a check nodes update, a variable nodes update and a syndrome check after an initial variable nodes update. After a first iteration, when the result of the syndrome check satisfies a predetermined condition, the LDPC decoding operation may end. When the result of the syndrome check does not satisfy the predetermined condition, an additional iteration may be performed. The additional iteration may also include the variable node update, the check node update and the syndrome check. The number of iterations may be limited to a predetermined maximum iteration count. When the result of the syndrome check does not satisfy the predetermined condition until the number of iterations reaches the predetermined maximum iteration count, the LDPC decoding operation, i.e., the ECC decoding operation on the codeword may be determined to have failed in LDPC decoding operation.

Referring to FIG. 8, the syndrome check is a process of identifying whether the product result "$Hv^T$" of the parity check matrix H and a vector "v", which is obtained by the update of the variable nodes 620, satisfies the predetermined condition. When the product result "$Hv^T$" becomes the zero vector, the product result "$Hv^T$" may be evaluated to satisfy the predetermined condition.

FIG. 8 shows the syndrome check process. F G. 8 exemplarily shows a non-zero vector "01000" as the product result "$Hv^T$", and thus FIG. 8 shows that the syndrome check does not satisfy the predetermined condition and another iteration should be performed.

Figure 9:
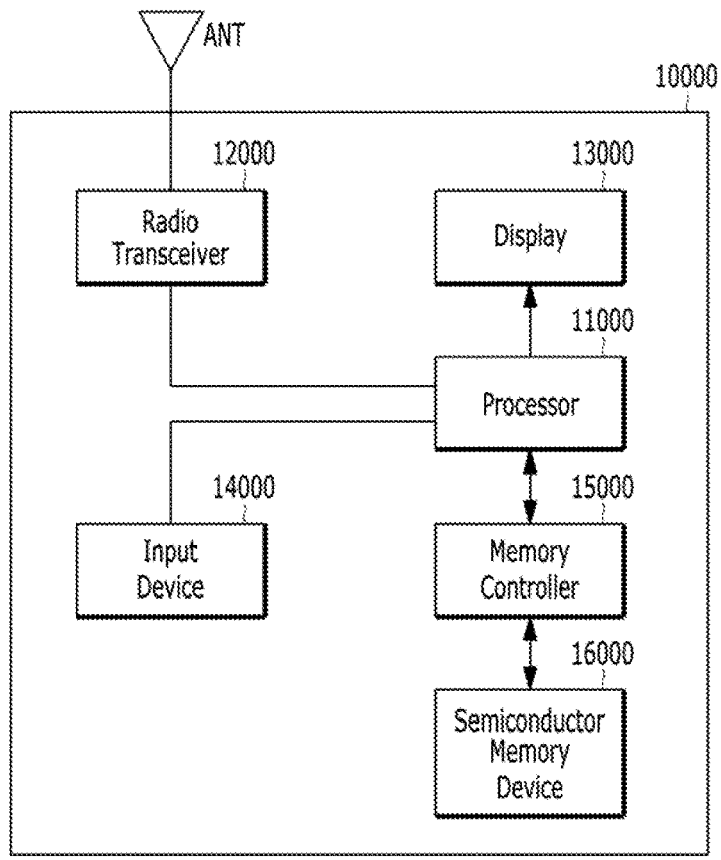
FIG. 9 is a block diagram schematically illustrating an electronic apparatus including a semiconductor memory system in accordance with an embodiment of the present invention.

FIG. 9 is a block diagram schematically illustrating an electronic device 10000 including a memory controller 15000 and a semiconductor memory device 16000 in accordance with an embodiment of the present invention.

Referring to FIG. 9, the electronic device 10000 may be any suitable electronic device such as a cellular phone, a smart phone, or a tablet PC. The semiconductor memory device 16000 may be implemented by any suitable memory device, including, for example, a flash memory device, such as NAND or a NOR flash. The memory controller 15000 may control the semiconductor memory device 16000.

The semiconductor memory device 16000 may correspond to the semiconductor memory device 200 described above with reference to FIGS. 3 to 4B. The semiconductor memory device 16000 may store random data.

The memory controller 15000 may correspond to the memory controller 100 described with reference to FIGS. 3 to 8. The memory controller 15000 may be controlled by a processor 11000 which controls overall operations of the electronic device 10000.

Data stored in the semiconductor memory device 16000 may be displayed through a display 13000 under the control of the memory controller 15000. The memory controller 15000 operates under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal and may output the converted radio signal to an external device through the antenna ANT.

An input device 14000 may receive a control signal for controlling operations of the processor 11000 or data to be processed by the processor 11000, and may be implemented by a pointing device such as a touch pad or a computer mouse, a key pad, or a keyboard.

The processor 11000 may control the display 13000 such that the data from the semiconductor memory device 16000, the radio signal from the radio transceiver 12000 or the data from the input device 14000 is displayed through the display 13000.

Figure 10:
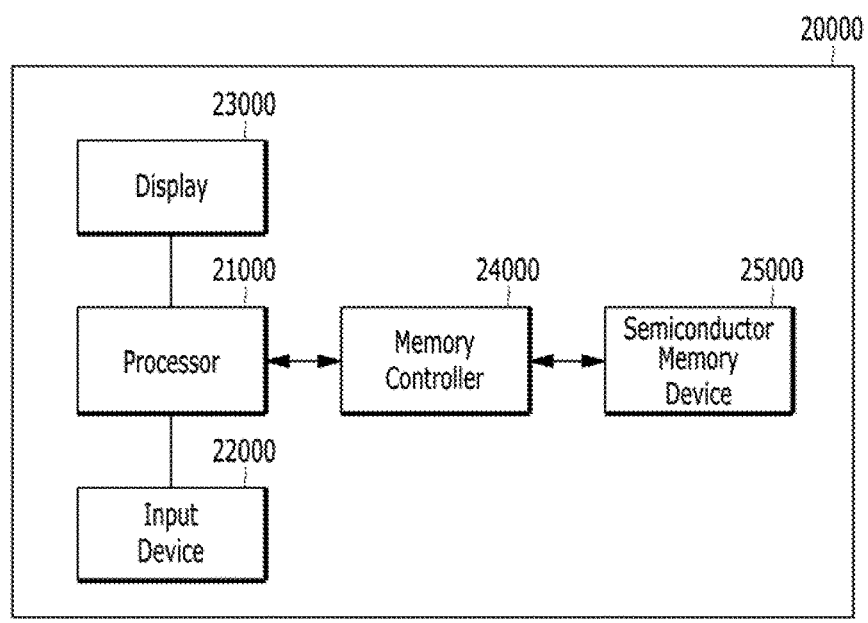
FIG. 10 is a block diagram schematically illustrating an electronic apparatus including a semiconductor memory system in accordance with another embodiment of the present invention.

FIG. 10 is a block diagram schematically illustrating an electronic device 20000 including a memory controller 24000 and a semiconductor memory device 25000 in accordance with an embodiment of the present invention.

The memory controller 24000 and the semiconductor memory device 25000 may correspond to the memory controller 100 and the semiconductor memory device 200 described with reference to FIGS. 3 to 8E, respectively.

Referring to FIG. 10, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player, and may include the semiconductor memory device 25000, e.g., a flash memory device and the memory controller 24000 to control operations of the semiconductor memory device 25000.

The electronic device 20000 may include a processor 21000 to control overall operations of the electronic device 20000. The memory controller 24000 may be controlled by the processor 21000.

The processor 21000 may display data stored in the semiconductor memory device 25000 through a display 23000 according to an input signal from an input device 22000. For example, the input device 22000 may be implemented by a pointing device such as a touch pad or a computer mouse, a key pad, or a keyboard.

Figure 11:
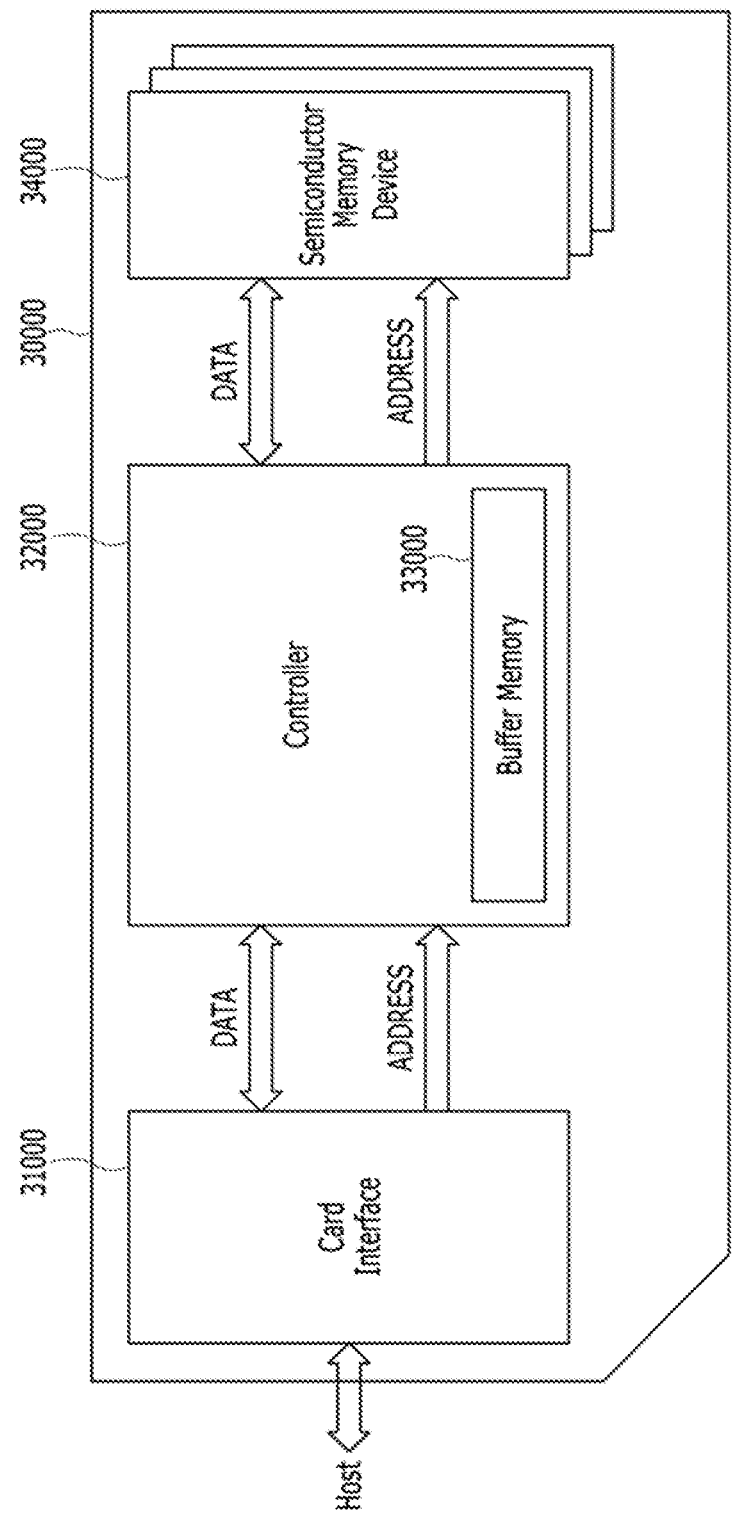
FIG. 11 is a block diagram schematically illustrating an electronic apparatus including a semiconductor memory system in accordance with yet another embodiment of the present invention.

FIG. 11 is a block diagram schematically illustrating an electronic device 30000 including a controller 32000 and a semiconductor memory device 34000 in accordance with an embodiment of the present invention.

The controller 32000 and the semiconductor memory device 34000 may correspond to the memory controller 100 and the semiconductor memory device 200 described with reference to FIGS. 3 to 8E, respectively.

Referring to FIG. 11, the electronic device 30000 may include a card interface 31000, the controller 32000, and the semiconductor memory device 34000, for example, a flash memory device.

The electronic device 30000 may exchange data with a host through the card interface 31000. The card interface 31000 may be a secure digital (SD) card interface or a multi-media card (MMC) interface, which will not limit the scope of the present invention. The card interface 31000 may interface the host and the controller 32000 according to a communication protocol of the host capable of communicating with the electronic device 30000.

The controller 32000 may control overall operations of the electronic device 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic device 30000 is connected with the host such as a PC, a tablet PC, a digital camera, a digital audio player, a mobile phone console video game hardware or a digital set-top box, the host may exchange data with the semiconductor memory device 34000 through the card interface 31000 and the controller 32000.

Figure 12:
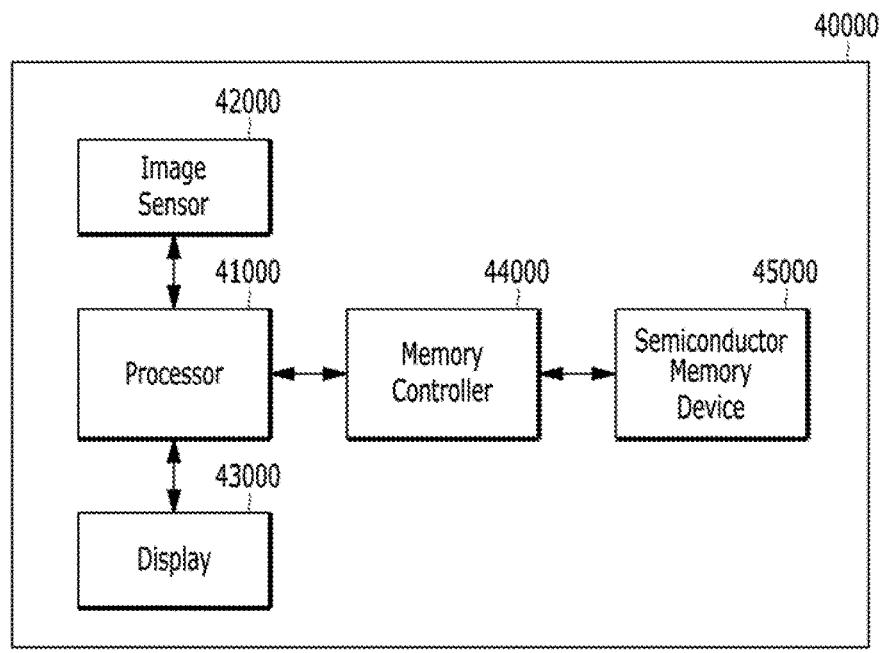
FIG. 12 is a block diagram schematically illustrating an electronic apparatus including a semiconductor memory system in accordance with yet another embodiment of the present invention.

FIG. 12 is a block diagram schematically illustrating an electronic device 40000 including a memory controller 44000 and a semiconductor memory device 45000 in accordance with yet another embodiment of the present invention.

The memory controller 44000 and the semiconductor memory device 45000 may correspond to the memory controller 100 and the semiconductor memory device 200 described with reference to FIGS. 3 to 8E, respectively.

Referring to FIG. 12, the electronic device 40000 may include the semiconductor memory device 45000 (e.g., a flash memory device), the memory controller 44000 to control a data processing operation of the semiconductor memory device 45000, an image sensor 42000, and a processor 41000 to control overall operations of the electronic device 40000.

The image sensor 42000 of the electronic device 40000 may convert an optical signal into a digital signal, and the converted digital signal may be stored in the semiconductor memory device 45000 under the control of the processor

41000. Otherwise, the converted digital signal may be displayed through a display 43000 under the control of the processor 41000.

Figure 13:
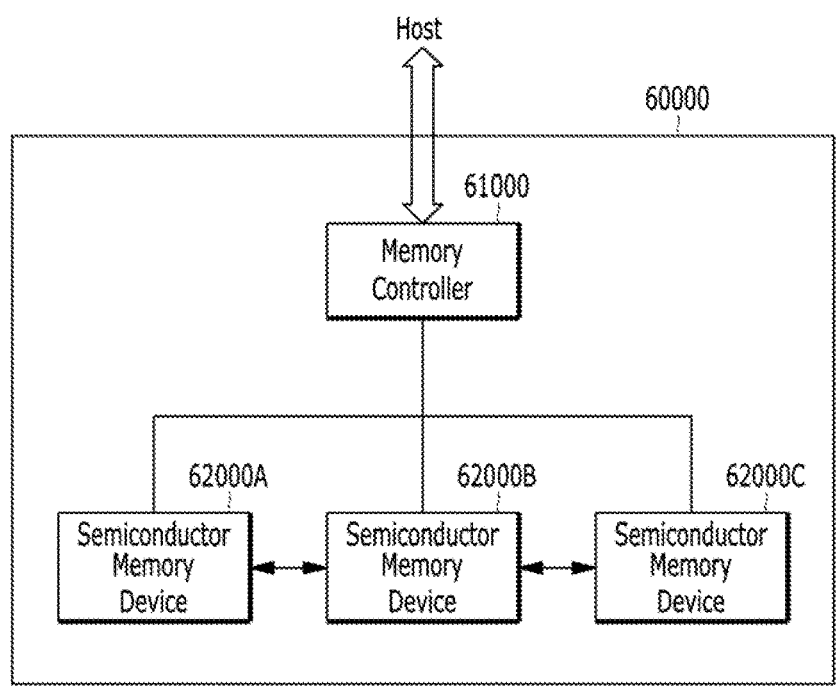
FIG. 13 is a block diagram schematically illustrating an electronic apparatus including a semiconductor memory system in accordance with yet another embodiment of the present invention.

FIG. 13 is a block diagram schematically illustrating an electronic device 60000 including a memory controller 61000 and semiconductor memory devices 62000A, 620006B, and 62000C in accordance with yet another embodiment of the present invention.

The memory controller 61000 and each of the semiconductor memory devices 62000A, 62000B, and 62000C may correspond to the memory controller 100 and the semiconductor memory device 200 described with reference to FIGS. 3 to 8E, respectively.

Referring to FIG. 13, the electronic device 60000 may be implemented by a data storage device such as a solid state drive (SSD).

The electronic device 60000 may include the plurality of semiconductor memory devices 62000A, 620006, and 62000C and the memory controller 61000 to control a data processing operation of each of the semiconductor memory devices 62000A, 62000B, and 62000C.

The electronic device 60000 may be implemented by a memory system or a memory module.

For example, the memory controller 61000 may be implemented outside or inside the electronic device 60000.

Figure 14:
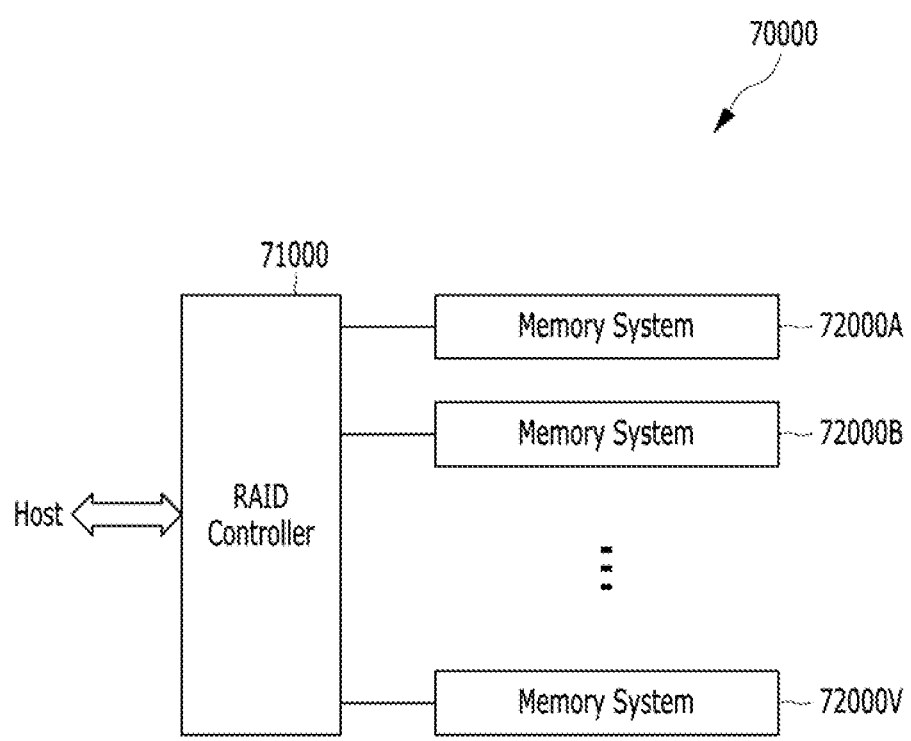
FIG. 14 is a block diagram illustrating a data processing system including the electronic apparatus of FIG. 13 in accordance with yet another embodiment of the present invention.

FIG. 14 is a block diagram of a data processing system including the electronic device 6000 described with reference to FIG. 13.

Figure 1:
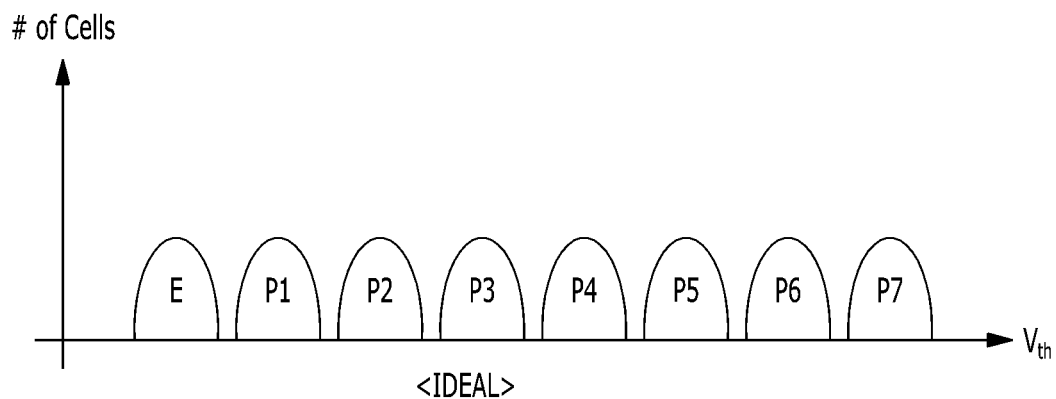
FIG. 1 is a threshold voltage distribution schematically illustrating program and erase states of a 3-bit TLC non-volatile memory device.
Figure 2:
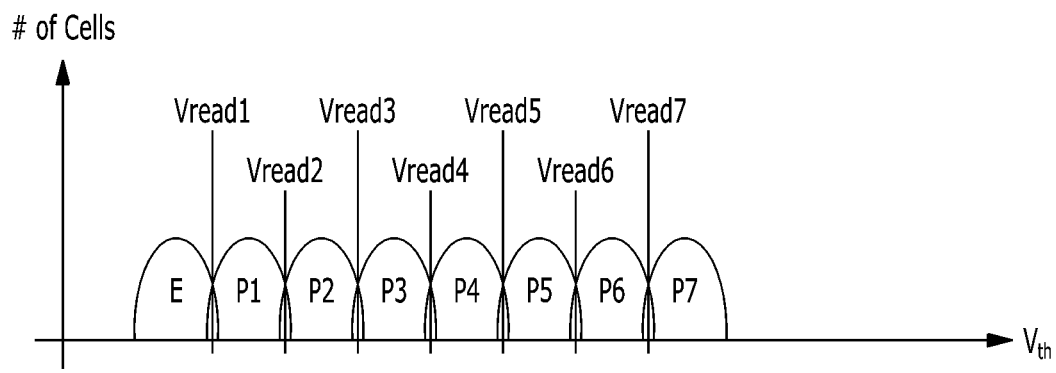
FIG. 2 is a threshold voltage distribution schematically illustrating program and erase states due to characteristic deterioration of a 3-bit TLC non-volatile memory device.

Referring to FIGS. 1 and 14, a data storage device 70000 may be implemented by a redundant array of independent disks (RAID) system. The data storage device 70000 may include a RAID controller 71000 and a plurality of memory systems 72000A to 72000N, where N is a natural number.

Each of the memory systems 72000A to 72000N may correspond to the electronic device 60000 described with reference to FIG. 13. The memory systems 72000A to 72000N may form a RAID array. The data storage device 70000 may be implemented by an SSD.

During a program operation, the RAID controller 71000 may output program data which is output from a host, to one of the memory systems 72000A to 72000N selected according to one of a plurality of RAID levels based on RAID level information output from the host.

During a read operation, the RAID controller 71000 may transfer data, which is read from one of the memory systems 72000A to 72000N, to the host according to one of the RAID levels based on the RAID level information output from the host.

While the present invention has been described with respect to specific embodiments, it will be apparent to those skilled in the art that various changes and modifications may be made without departing from the spirit and scope of the invention as, defined in the following claims.

What is claimed is:

1. An operation method of a memory controller, the operation method comprising:
   reading a second data from memory cells by an Error Correction Code (ECC) circuit when a hard decision error correction decoding operation based on a first data read from the memory cells fails;
   calculating a Log Likelihood Ratio (LLR) by the ECC circuit of each bit-data included in the first data by using the first data and the second data; and
   performing a soft decision error correction decoding operation by the ECC circuit based on the LLR,
   wherein the memory cells include a first memory cell and a second memory cell adjacent to the first memory cell,
   wherein the first data includes first-bit-data read from the first memory cell and the second memory cell,
   wherein the second data includes second-bit-data read from the first memory cell and the second memory cell,
   wherein the LLR is a LLR of the first-bit-data read from the first memory cell calculated based on a first bit and a second bit read from the first memory cell and a first bit and a second bit read from the second memory cell, and
   wherein the LLR is an LLR of a conditional probability that the first and second data read from the first memory cell are in a certain status and the first and second data read from the second memory cell are in a certain status when the first-bit-data stored in the first memory cell has a value of "0" to a conditional probability that the first and second data read from the first memory cell are in a certain status and the first and second data read from the second memory cell are in a certain status when the first-bit-data stored in the first memory cell has a value of "1", and
   wherein the certain status is one of an erase status and one or more of program statuses.

2. The operation method of claim 1,
   wherein each of the memory cells stores n-bit-data,
   wherein each of the first-bit-data corresponds to an i-th-bit-data of the n-bit-data stored in each of the memory cells,
   wherein each of the second-bit-data corresponds to bit-data other than the i-th-bit-data of the n-bit-data stored in each of the memory cells,
   wherein the n is an integer greater than 2, and
   wherein the i is an integer greater than 1.

3. The operation method of claim 2, wherein the i-th-bit-data corresponds to a most significant bit (MSB) data of the n-bit-data.

4. The operation method of claim 2, wherein the n is 2.

5. The operation method of claim 1, wherein the first memory cell and the second memory cell are placed on the same word line.

6. The operation method of claim 5, wherein the second memory cell is placed next to the first memory cell on the same word line.

7. The operation method of claim 1, wherein the first memory cell and the second memory cell are placed on the same bit line.

8. The operation method of claim 7, wherein the second memory cell is placed next to the first memory cell on the same bit line.

9. A memory controller comprising:
   an Error Correction Code ECC) circuit configured to:
   read a second data from memory cells when a hard decision error correction decoding operation based on a first data read from memory cells fails; calculate a Log Likelihood Ratio (LLR) of each bit-data included in the first data by using the first data and the second data; and perform a soft decision error correction decoding operation based on the LLR,
   wherein the memory cells include a first memory cell and a second memory cell adjacent to the first memory cell,
   wherein the first data includes first-bit-data read from the first memory cell and the second memory cell,
   wherein the second data includes second-bit-data read from the first memory cell and the second memory cell,
   wherein the LLR is a LLR of the first-bit-data read from the first memory cell calculated based on a first bit and a second bit read from the first memory cell and a first bit and a second bit read from the second memory cell, and wherein the LLR is an LLR of a conditional probability that the first and second data read from the first memory cell are in a certain status and the first and second data read from the second memory cell are in a certain status when the first-bit-data stored in the first memory cell has a value of "0" to a conditional probability that the first and second data read from the first memory cell are in a certain status and the first and second data read from the second memory cell are in a certain status when the first-bit-data stored in the first memory cell has a value of "1", and wherein the certain status is one of an erase status and one or more of program statuses.

10. The memory controller of claim 9, wherein each of the memory cells stores n-bit-data, wherein each of the first-bit-data corresponds to an i-th-bit-data of the n-bit-data stored in each of the memory cells, wherein each of the second-bit-data corresponds to bit-data other than the i-th-bit-data of the n-bit-data stored in each of the memory cells, wherein the n is an integer greater than 2, and wherein the i is an integer greater than 1.

11. The memory controller of claim 10, wherein the i-th-bit-data corresponds to a most significant bit (MSB) data of the n-bit-data.

12. The memory controller of claim 10, wherein the n is 2.

13. The memory controller of claim 9, wherein the first memory cell and the second memory cell are placed on the same word line.

14. The memory controller of claim 13, wherein the second memory cell is placed next to the first memory cell on the same word line.

15. The memory controller of claim 9, wherein the first memory cell and the second memory cell are placed on the same bit line.

16. The memory controller of claim 15, wherein the second memory cell is placed next to the first memory cell on the same bit line.

* * * * *